(12) United States Patent
Baker et al.

(10) Patent No.: US 7,660,108 B2
(45) Date of Patent: Feb. 9, 2010

(54) APPARATUS FOR POSITIONING ELECTRONIC COMPONENT MODULES WITHIN AN EQUIPMENT CHASSIS

(75) Inventors: Bruce Edwin Baker, Round Rock, TX (US); Matthew Scott Henry, San Diego, CA (US); David John Jensen, Raleigh, NC (US); Seth David Lewis, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 385 days.

(21) Appl. No.: 11/627,151

(22) Filed: Jan. 25, 2007

(65) Prior Publication Data

US 2008/0180918 A1    Jul. 31, 2008

(51) Int. Cl.
| | |
|---|---|
| G06F 1/16 | (2006.01) |
| A47B 81/00 | (2006.01) |
| A47F 7/00 | (2006.01) |
| A47F 5/00 | (2006.01) |
| G12B 9/00 | (2006.01) |

(52) U.S. Cl. .............. 361/679.39; 312/223.2; 211/26; 248/27.3; 248/298.1

(58) Field of Classification Search ......... 361/724–727, 361/679.01–679.45; 312/223.1, 223.2; 211/26; 248/27.1, 27.3, 298.1, 424.429
See application file for complete search history.

(56) References Cited

U.S. PATENT DOCUMENTS

| | | | |
|---|---|---|---|
| 4,937,806 A | * | 6/1990 | Babson et al. .............. 720/651 |
| 5,340,340 A | * | 8/1994 | Hastings et al. ............... 439/64 |
| 5,737,168 A | | 4/1998 | Baker |
| 6,033,793 A | | 3/2000 | Woods et al. |
| 6,067,483 A | | 5/2000 | Fesmire et al. |
| 6,611,424 B2 | * | 8/2003 | Huang .................. 361/679.39 |

OTHER PUBLICATIONS

"DAMES: An Integrated System Approach to Computer Aided Design of Electronic Systems"; Robert Lewis and Ronald Segal; pp. 27-1 through 27-16.
"Unconventional Human Computer Interfaces"; Course 17; Siggraph 2004; Steffi Beckhaus and Ernst Kruijff; 209 pages; 2004.
Robert Lewis and Ronald Segal; DAMES: An Integrated System Approach to Computer Aided Design of Electronic Systems; pp. 27-1 through 27-16.
Steffi Beckhaus and Ernst Kruijff; Unconventional Human Computer Interfaces; Course 17; Siggraph 2004;; 209 pages; 2004.

* cited by examiner

*Primary Examiner*—Jayprakash N Gandhi
*Assistant Examiner*—Nidhi Desai
(74) *Attorney, Agent, or Firm*—Cynthia G. Seal; Jeffrey L. Streets

(57) ABSTRACT

An apparatus for positioning an electronics module in an equipment chassis with adequate pathways for the flow of cooling air across the module or across one or more adjacent modules, such as one or more blade server. The system includes an electronics module movably secured within a sub-assembly prior to installing the sub-assembly in a bay of a chassis. Ramps disposed within one or more bays of the chassis engage and position the electronics modules within the range of movement permitted by the sub-assembly when the sub-assembly has been installed in the chassis. Two bays having ramps positioned differently can receive the same sub-assembly or an identical sub-assembly and position the module differently. Therefore, the sub-assemblies are interchangeable while maintaining appropriate air flow pathways.

19 Claims, 5 Drawing Sheets

APPARATUS FOR POSITIONING ELECTRONIC COMPONENT MODULES WITHIN AN EQUIPMENT CHASSIS

BACKGROUND OF THE INVENTION

1. Field of the Invention

The present invention relates to rack mounted equipment containing electronics modules that require cooling. More specifically, the present invention relates to a system for positioning and cooling electronics modules within a chassis.

2. Description of the Related Art

Large computer systems are often consolidated into centralized data centers. Rack systems, in particular, conserve space and put the servers and infrastructure within easy reach of an administrator. "Blade" servers are among the more compact server arrangements. A blade server, such as the IBM eServer BLADECENTER (IBM and BLADECENTER are registered trademarks of International Business Machines Corporation, Armonk, N.Y.), is a type of rack-optimized server that eliminates many of the complications of previous generation rack servers. These servers have electronic components that perform various functions and generate heat as a byproduct of electrical resistance. Due to the compact nature of rack systems, individual servers share a thermal environment with other hardware, such as enclosures, power supplies, fans, and management hardware. Managing and maintaining proper cooling is therefore critical and is typically accomplished by blowing air through the chassis and across the various electronic components. Because of the large number of components typically housed within rack systems, the airflow and heating patterns can be fairly complicated and unique to a particular installation. Many potential causes of thermal problems exist that can lead to component failure and increase the complication and expense of system maintenance.

A rack system includes one or more chassis for receiving, storing and operating electronics modules. The modules may be arranged in various configurations within a chassis, such as vertically or horizontally aligned with each module in a spaced-apart, parallel relationship to adjacent modules so that heat generated within each module will dissipate into air passing across the modules. Fan packs are used to move air across modules for improved heat transfer.

The performance requirements of the computer system dictate the design of the chassis. For example, each module is preferably independently installable in, and removable from, the chassis. Proper cooling of modules is critical to obtain reliable performance and longevity from the equipment. Any restrictions in the flow of cooling air may cause overheating and premature failure of a component in one or more module.

However, a compact chassis is generally also desirable to save space. Computer rooms are commonly climate controlled, designed to prevent dust, and include false floors or other accommodations for numerous electrical connections and lines of communication. The expense involved in building and maintaining these facilities dictates that the facilities should be used efficiently and contain numerous computer modules in a small space while continuing to meet the cooling air flow needs of each individual module.

Therefore, there is a need for a system for efficiently installing and positioning multiple modules within a chassis to ensure adequate cooling of heat-generating modules while maintaining a compact chassis. It would be desirable if the system was flexible enough to accommodate numerous configurations of modules as found necessary at a particular computer installation.

SUMMARY OF THE INVENTION

The present invention provides an apparatus for positioning an electronics module within a chassis. The apparatus comprises a sub-assembly including a set of generally parallel rails and an electronics module movably secured between the rails, wherein the electronics module is movable in a direction generally perpendicular to the axis of the rails. The apparatus also comprises a chassis including a first bay for slidably receiving the rails of the sub-assembly and a first ramp, wherein the ramps position the electronics module as the rails are received in the first bay to establish the axial position of the electronics module. Optionally, the electronics module may include protrusions slidably received in slots in the rails. An alternate arrangement with protrusions on the rails and slots in the electronics module can also be implemented. Preferably, the sub-assembly further comprises a connector for fixedly coupling the generally parallel rails.

In one embodiment, the chassis further includes a second bay for slidably receiving the rails of the sub-assembly and a second ramp, wherein the first ramp of the first bay positions the electronics module in a first direction and the second ramp of the second bay positions the electronics module in a second direction. The apparatus may then further comprise a second sub-assembly including a set of generally parallel rails and an electronics module movably secured between the rails, wherein the electronics module is movable in a direction generally perpendicular to the rails, and wherein the first sub-assembly is received in the first bay and the second sub-assembly is received in the second bay. It is a beneficial aspect of this embodiment, that the first and second sub-assemblies may be interchangeably received in either of the first and second bays.

In another embodiment, the sub-assembly further includes a second module fixedly secured between the rails. Optionally, the second module is the full height of the bay and first module is less than the full height of the bay. Accordingly, if the first module is secured to the rails distal to the second module so that the first module is inserted into the bay before the second module, then the ramps are preferably disposed only in the distal end of the bay to avoid engagement with the second module. The first module is preferably a power module and the second module is preferably a fan pack.

The chassis may also house a plurality of blade servers, and the ramps may position the electronics module away from the blade servers. In a further embodiment, the first bay is at the top of the chassis and has a ramp that positions the electronics module upward, and wherein the second bay is at the bottom of the chassis and has a ramp that positions the electronics module downward. Most preferably, the ramp in the top bay forms an air flow pathway below the electronics module of a first sub-assembly and the ramp in the lower bay forms an air flow pathway above the electronics module in a second sub-assembly.

DETAILED DESCRIPTION

The present invention provides a system for positioning an electronics module in an equipment chassis with adequate pathways for the flow of cooling air across the module or across one or more adjacent modules, such as one or more blade server. The system includes an electronics module movably secured within a sub-assembly prior to installing the sub-assembly in a bay of a chassis. Ramps disposed within one or more bays of the chassis engage and position the electronics modules within the range of movement permitted by the sub-assembly when the subassembly has been installed in the chassis.

One embodiment of the present invention comprises an electronics module slidably secured to the rails of a sub-assembly. The module is slidably secured with one or more protrusions extending generally horizontally from each side of the module for being slidably received into one or more slots in the rails sub-assembly. The protrusions extending from the module may comprise pins, rods, knobs or any other structures for collectively supporting the weight of the electronics module within the sub-assembly. Preferably, there will be at least two protrusions extending from each side of the electronics module, one spaced apart from the other to evenly distribute the weight of the electronics module to the rails of the sub-assembly.

Figure 1:
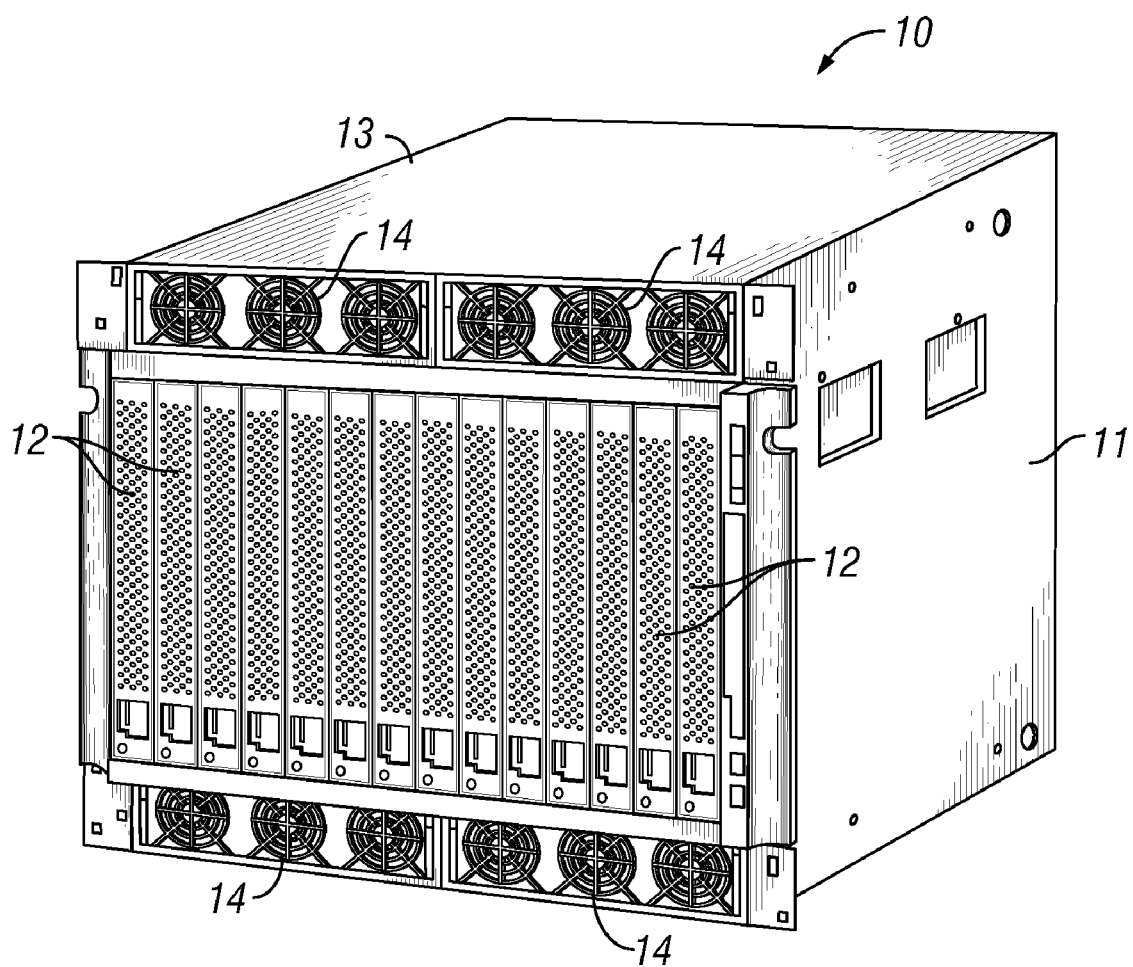
FIG. 1 is a perspective view of one embodiment of an equipment chassis of the present invention having multiple bays for receiving, supporting and storing sub-assemblies within bays.

FIG. 1 is a perspective view of an embodiment of an electronic equipment chassis 10 of the present invention. The chassis 10 receives a plurality of blade servers 12 and a plurality of sub-assemblies 14 that each includes a fan pack and an electronics module (not shown) behind the fan pack. The blade servers 12 in the chassis 10 are shown received in fourteen side-by-side vertical bays and the sub-assemblies 14 are shown received in two top horizontal bays and two bottom horizontal bays. The chassis 10 comprises a pair of generally parallel and vertical side panels 11 coupled to a pair of generally parallel and horizontal top and bottom panels 13. The chassis further comprises interior panels or guides defining bays within the chassis 10 for receiving the sub-assemblies 14. Optionally, the chassis may further comprise a front panel (not shown) and a rear panel (not shown) that are removable or hinged to a side panel to provide convenient access to the bays of the chassis 10 for receiving or removing server blades 12 or sub-assemblies 14.

One or more bays within the chassis 10 may also contain ramps to engage and position a modules secured between rails of a sub-assembly 14. Each bay is taller (vertically as shown in FIG. 1) than the module within it to provide a bypass air flow pathway. The module is movably secured within the rails of the sub-assembly 14, and the sub-assembly 14 is slidably received within the bay of the chassis 10.

An electronics module is secured within a sub-assembly that "docks" in the chassis by sliding the sub-assembly 14 into a bay in the chassis. The sub-assembly may have a tapered snout to facilitate insertion into, or communication with, the bays of a chassis. For example, a chassis may have a plurality of generally horizontal bays each 60 mm in height for receiving and storing a sub-assembly 14, and a typical module may occupy only 50 mm of the available height of the bay. The remaining 10 mm of space remains available for cooling air flow to ensure proper operating temperature. Frequently, the sub-assembly will also include a fixed module that is the full height of the bay, such as a 60 mm tall fan pack.

Figure 2A:
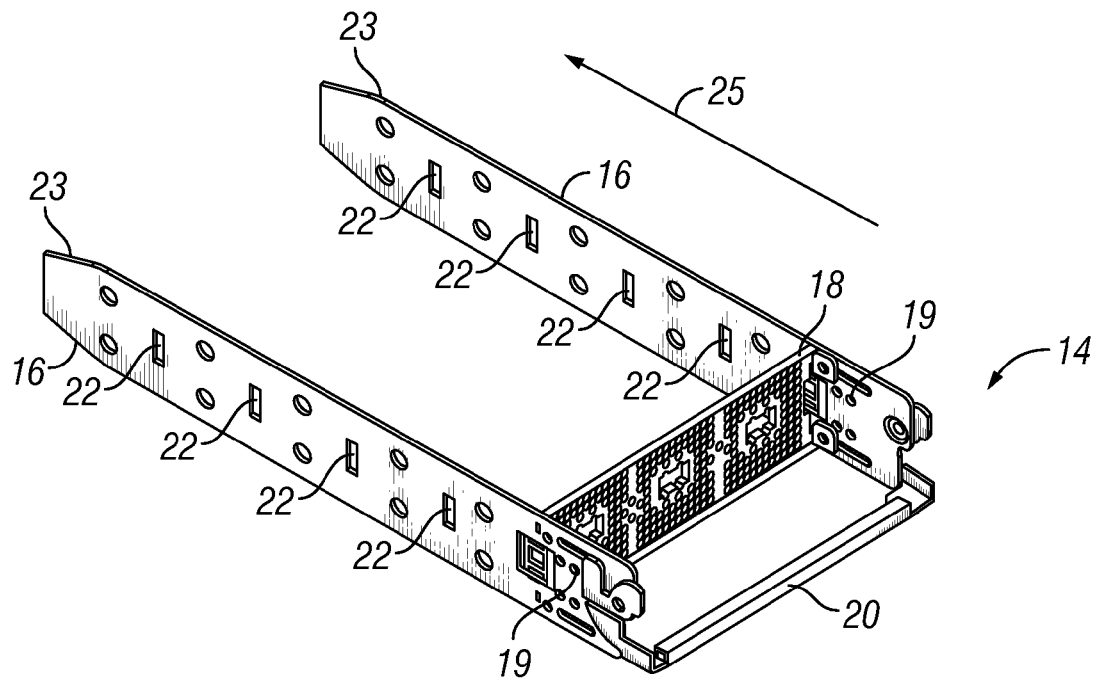
FIG. 2A is a perspective view of one embodiment of a sub-assembly 14 comprising a pair of generally parallel rails secured together with a cross-member and a handle to maintain the rails in a generally parallel relationship.

FIG. 2A is a perspective view of one embodiment of a sub-assembly 14 comprising a pair of generally parallel rails 16 secured together from a cross-member 18 and a handle 20 to maintain rails 16 in their generally parallel relationship. The cross-member 18 may be generally planar and may comprise a plurality of holes for air flow through the cross-member 18. Each rail 16 also has a tapered distal end 23 that facilitates the initiation of communication with a bay in the chassis. Furthermore, the sub-assembly 14 may have one or more holes 19 in each rail 16 for securing a fan pack (not shown in FIG. 2A) to the sub-assembly 14. The rails 16 include one or more slots 22 for receiving protrusions 26 extending horizontally from an electronics module 24 (not shown in FIG. 2A; see FIG. 2B). The generally vertical slots 22 on each rail 16 of the sub-assembly 14 restrict the movement of the module 24 so that the module will move only in a direction generally perpendicular (up and down as shown in FIG. 4A) to the direction of insertion 25 of the sub-assembly 14 into the chassis.

Figure 2B:
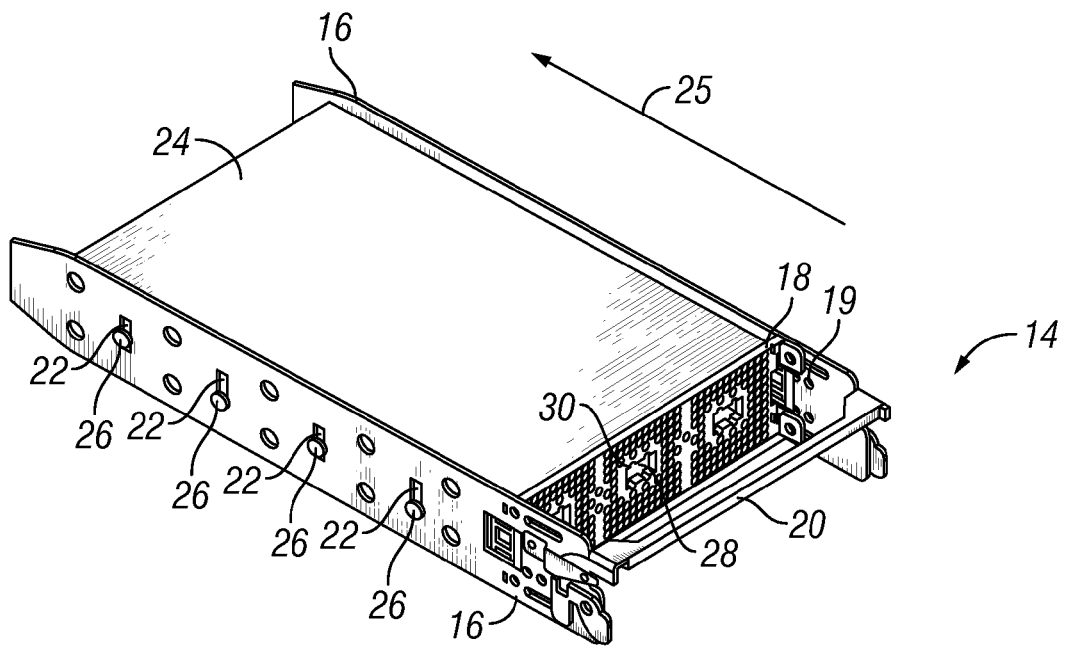
FIG. 2B shows a perspective view of the sub-assembly of FIG. 2A movably supporting an electronics module.

FIG. 2B shows a perspective view of the sub-assembly 14 of FIG. 2A movably supporting an electronics module 24. The electronics module 24 includes horizontally-extending protrusions 26 that are movably received into the slots 22 of the sub-assembly rails 16. The cross-member 18 may comprise openings 28 providing access to connectors 30 on the electronics module 24.

Figure 3:
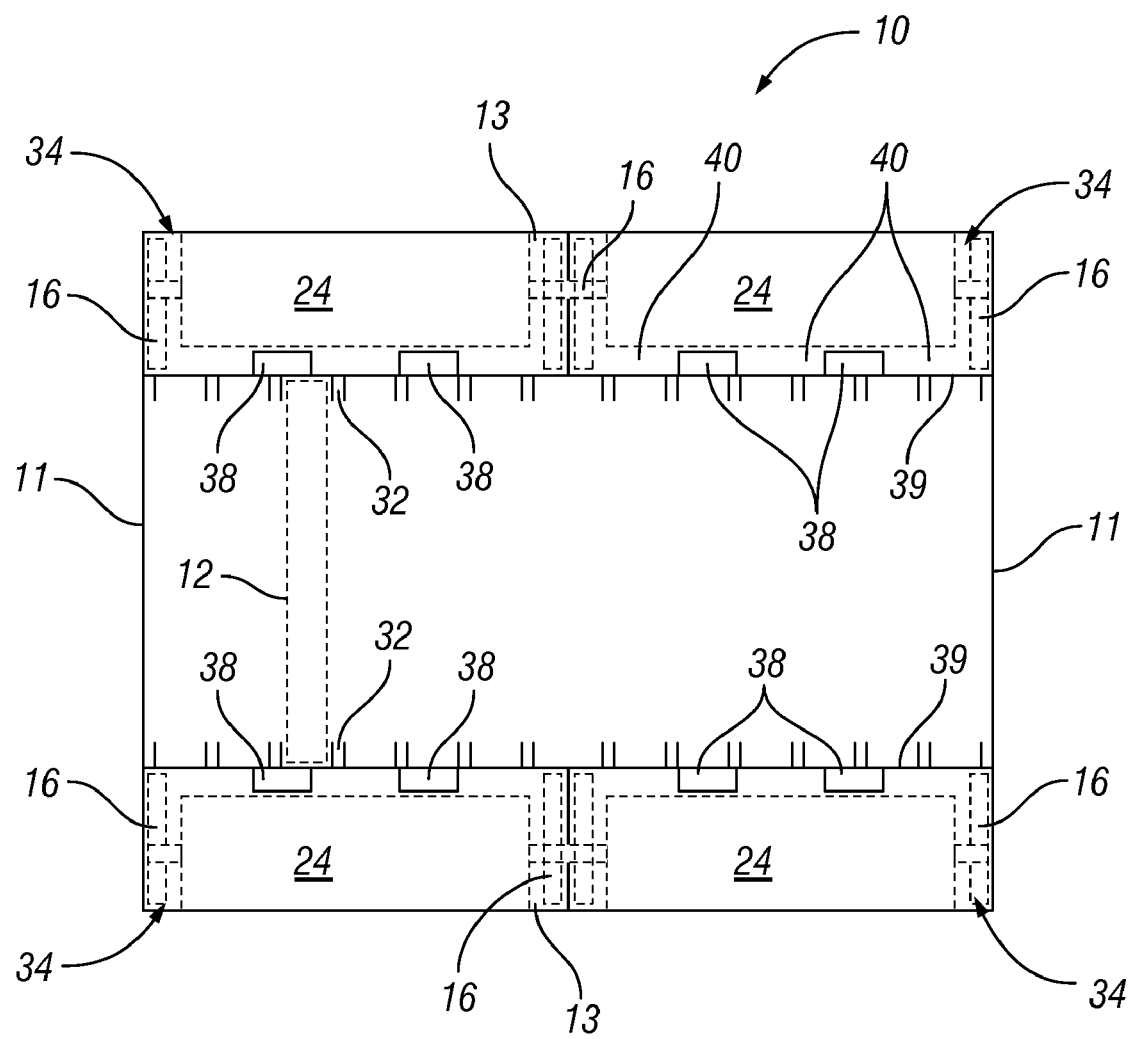
FIG. 3 is an end view of the chassis of FIG. 1.

FIG. 3 is an end view of the chassis 10 of FIG. 1. The chassis 10 includes the side walls 11 and the top and bottom walls 13. A central region comprises a plurality of panels or guides 32 coupled to the interior panel 33 that establish bays for receiving server blades 12 (not shown). The chassis also includes four bays 34 for receiving sub-assemblies 14 of FIGS. 2A-B. Each of the four bays 34 is suitably dimensioned to receive rails 16 of the sub-assembly 14 and significantly controlling the positioning of the sub-assembly 14. When a sub-assembly 14 has been received in any one of the bays 34, the electronics module 24 of that sub-assembly is positioned by engaging one or more ramps 38 to create an air flow path 40 that spans the area between the module 24 and the wall 39 of the bay 34 that includes the ramps 38. As illustrated, identical sub-assemblies can be positioned to either the upper or lower bays 34, yet create an air flow path below the module in the upper bays and above the module in the lower bays without changing the orientation of the sub-assembly. Suitable ramps 38 could alternatively be secured to the interior walls of a side panel 32.

Figure 4A:
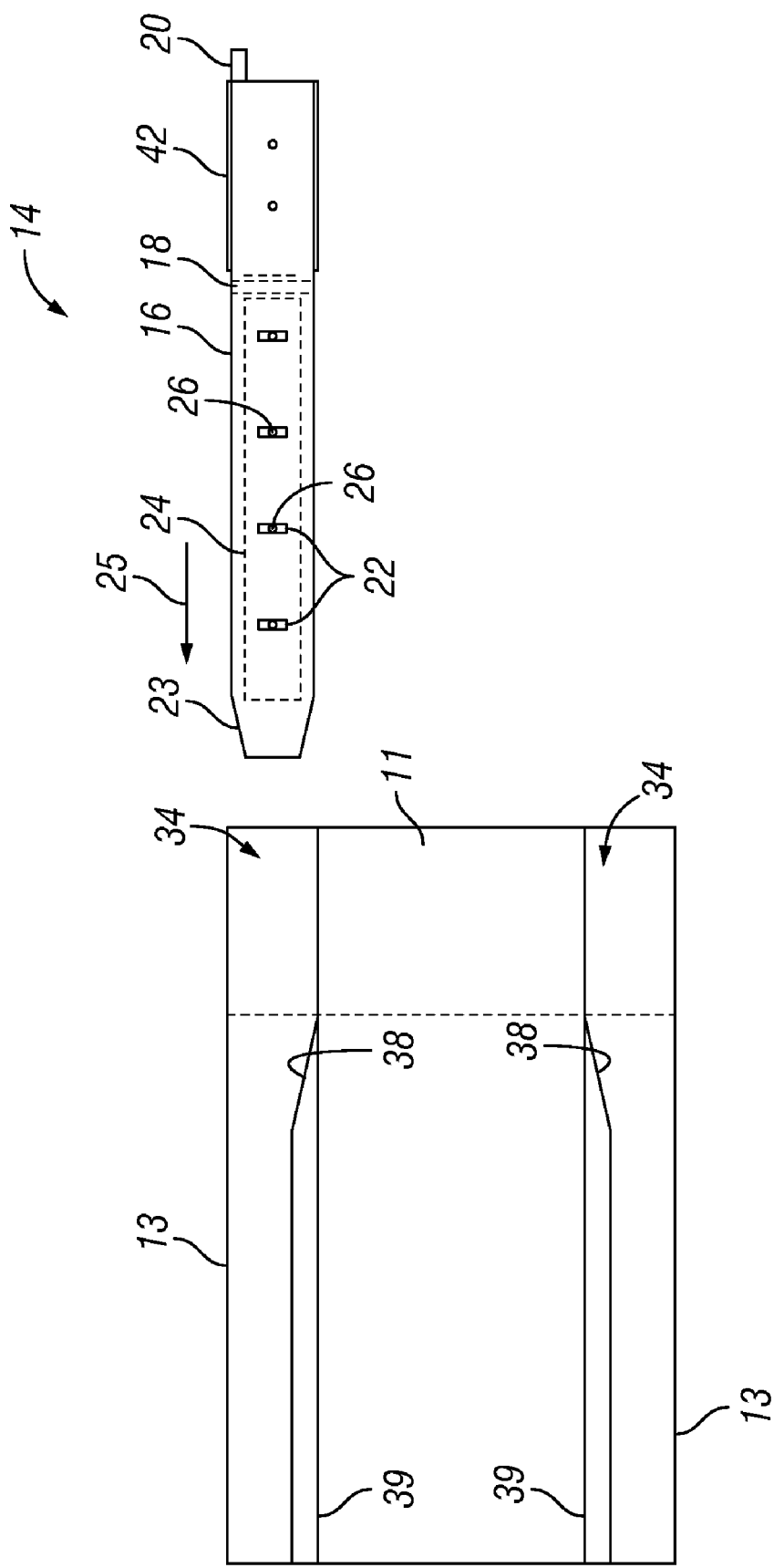
FIG. 4A-C are schematic interior side views of a side panel of a chassis comprising upper and lower bays for slidably receiving a sub-assembly and positioning an electronics module.

FIG. 4A is a schematic interior side view of a side panel 11 of a chassis 10 comprising upper and lower bays 34 for slidably receiving a sub-assembly 14. As shown, each bay 34 includes part of a side panel 11 of the chassis, an opposing intermediate panel (See FIG. 3), a part of the interior panel 39 and a part of the upper or lower panels 13 for slidably receiving a sub-assembly 14. Each bay 34 further comprises one or more ramps 38 to engage and position a module 24 within the range of movement provided by the protrusions 26 that extend through the generally vertical slots 22 in the rails 16. The sub-assembly 14 also includes a fan pack 42 that is fixed to the rails 16 and has a height almost equal to the height of the bay 34.

Figure 4B:
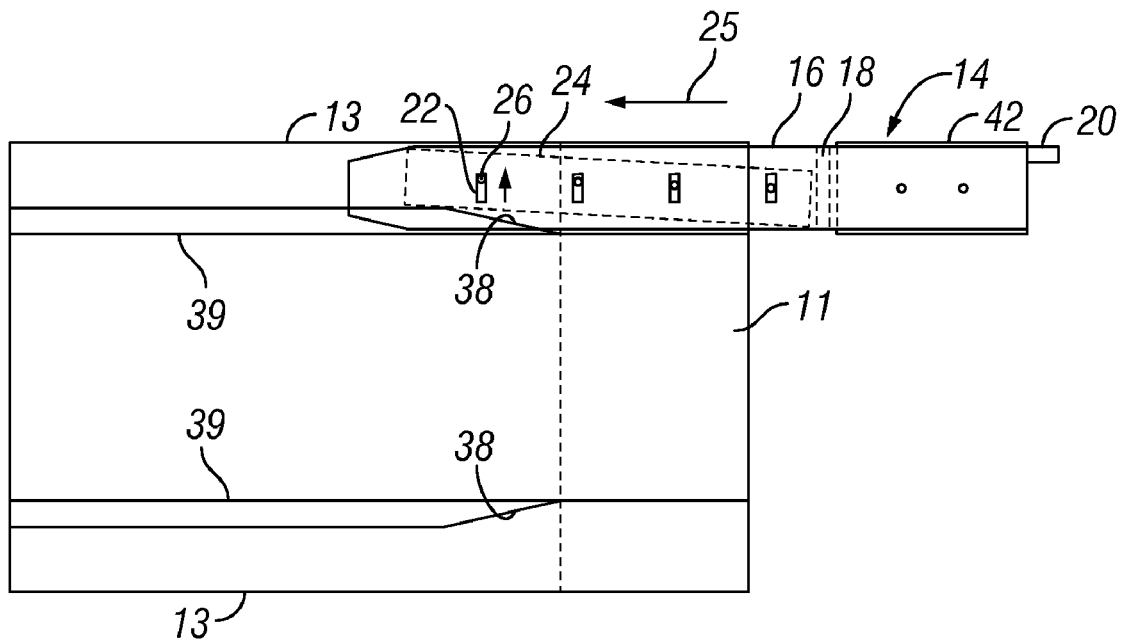

FIG. 4B is a schematic interior side view of a side panel 11 of a chassis 10 in accordance with FIG. 4A, with the sub-assembly 14 received about half way into the upper bay 34. The rails 16 are received in communication with the bay panels to vertically position the sub-assembly 14 with the bay 34. The module 24 has a leading edge that has engaged the ramp 38 to bias the leading edge upward within the bay 34. Each ramp 38 comprises an angled portion to gradually push the module 24 upward as it is received into the bay 34 as it continues to be pushed in the insertion direction 25. Note that the protrusion 26 in the leading slot 22 is now nearly at the full upward extent of its range of travel and the module 24 is slightly tilted upward.

Figure 4C:
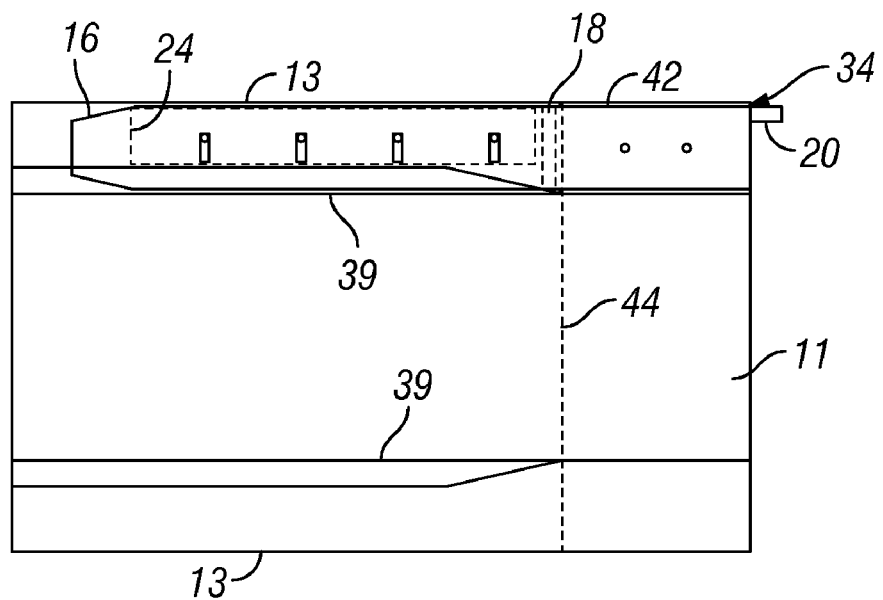

FIG. 4C is a schematic interior side view of a side panel 11 of a chassis 10 in accordance with FIG. 4A-B, with the sub-assembly 14 received fully into the upper bay 34. The upward position of the module 24 within the bay 34 is maintained by the level portion of the ramp 38 that is generally parallel to the axis of the bay. The position of the sub-assembly 14 within the chassis 10 is determined by the bays 34 of the chassis 10. The vertical position of a module 24 within the sub-assembly 14, and within a bay 34 of the chassis 10, is determined by the position of ramps 38 that engage and position the module 24 upon insertion of the sub-assembly 14. Accordingly, insertion of the same sub-assembly into the lower bay having ramps secured on an upper wall 39 would position the module 24 in a downward position.

As shown in the FIGS. 4A-B, the fan pack 42 not only fills the bay vertically, but extends into the bay a certain distance. In order for the ramps 38 to raise the module 24 without interfering with the fan pack 42, the ramps preferably extend only in a region inward (to the left in FIG. 4C) of the fan pack 42 as indicated by the dashed line 44.

The terms "comprising," "including," and "having," as used in the claims and specification herein, shall be considered as indicating an open group that may include other elements not specified. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition or step being referred to is an optional (not required) feature of the invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An apparatus for positioning an electronics module within a chassis comprising: a sub-assembly including a set of generally parallel rails and an electronics module slidably secured between the rails, wherein the electronics module is movable in a direction generally perpendicular to the rails; a chassis including a first ramp and a first bay for slidably receiving the rails of the sub-assembly, wherein the first ramp positions the electronics module in the generally perpendicular direction as the rails are received in the first bay to establish the axial position of the electronics module; wherein the electronics module includes protrusions slidably received in slots in the rails.

2. The apparatus of claim 1, wherein the chassis further includes a second ramp and a second bay for slidably receiving the rails of the sub-assembly, wherein the first ramp of the first bay positions the electronics module in a first direction and the second ramp of the second bay positions the electronics module in a second direction.

3. The apparatus of claim 1, wherein the sub-assembly further comprises:
a connector for fixedly coupling the generally parallel rails.

4. The apparatus of claim 3, wherein the connector further comprises a planar member with a plurality of holes to allow air flow through the member.

5. The apparatus of claim 1, wherein the sub-assembly further includes a second module fixedly secured between the rails.

6. The apparatus of claim 5, wherein the second module is a fan pack.

7. The apparatus of claim 6, wherein the first module is a power module.

8. The apparatus of claim 5, wherein the second module is the full height of the bay and first module is less than the full height of the bay.

9. The apparatus of claim 8, wherein the first module is secured to the rails distal to the second module so that the first module is inserted into the bay before the second module.

10. The apparatus of claim 9, wherein the ramps are disposed only in the distal end of the bay to avoid engagement with the second module.

11. The apparatus of claim 1, wherein the chassis houses a plurality of blade servers, and wherein the ramps position the electronics module away from the blade servers.

12. The apparatus of claim 2, wherein the first bay is at the top of the chassis and has a ramp that positions the electronics module upward, and wherein the second bay is at the bottom of the chassis and has a ramp that positions the electronics module downward.

13. The apparatus of claim 12, wherein the ramp in the top bay forms an air flow pathway below the electronics module and the ramp in the lower bay forms an air flow pathway above the electronics module.

14. The apparatus of claim 2, further comprising:
a second sub-assembly including a set of generally parallel rails and an electronics module slidably secured between the rails, wherein the electronics module is movable in a direction generally perpendicular to the rails, and wherein the first sub-assembly is received in the first bay and the second sub-assembly is received in the second bay.

15. The apparatus of claim 14, wherein the first and second sub-assemblies may be interchangeably received in either of the first and second bays.

16. The apparatus of claim 15, wherein the sub-assembly further includes a second module fixedly secured between the rails.

17. The apparatus of claim 16, wherein the second module is the full height of the bay and first module is less than the full height of the bay.

18. The apparatus of claim 17, wherein the first module is secured to the rails distal to the second module so that the first module is inserted into the bay before the second module.

19. The apparatus of claim 18, wherein the ramps are disposed only in the distal end of the bay to avoid engagement with the second module.

* * * * *